(12) United States Patent
Yoon et al.

(10) Patent No.: US 7,927,781 B2
(45) Date of Patent: Apr. 19, 2011

(54) PHOTOSENSITIVE RESIN COMPOSITION, METHOD FOR PREPARING THE SAME, AND DRY FILM RESIST COMPRISING THE SAME

(75) Inventors: In-Ho Yoon, Suwon (KR); Bong-Gi Kim, Hwassong (KR); Chang-Seok Rho, Busan (KR); Sang-Ki Kang, Jeonju (KR); Kyung-Rock Byun, Hwaseong (KR); Chan-Seok Park, Hwaseong (KR)

(73) Assignee: Dongjin Semichem Co., Ltd., Incheon (KR)

( * ) Notice: Subject to any disclaimer, the term of this patent is extended or adjusted under 35 U.S.C. 154(b) by 47 days.

(21) Appl. No.: 12/328,037

(22) Filed: Dec. 4, 2008

(65) Prior Publication Data

US 2009/0136872 A1 May 28, 2009

Related U.S. Application Data

(63) Continuation-in-part of application No. 11/292,411, filed on Nov. 30, 2005, now abandoned.

(30) Foreign Application Priority Data

Nov. 30, 2004 (KR) .................. 10-2004-0099483

(51) Int. Cl.
*G03F 7/029* (2006.01)
*G03F 7/033* (2006.01)

(52) U.S. Cl. .............. 430/285.1; 430/281.1; 430/915; 430/916; 430/923; 430/920; 430/926; 522/16; 522/38

(58) Field of Classification Search .................. None
See application file for complete search history.

(56) References Cited

U.S. PATENT DOCUMENTS

| | | | |
|---|---|---|---|
| 4,695,532 A | 9/1987 | Ponticello et al. | |
| 5,607,985 A | 3/1997 | Masuhara et al. | |
| 2002/0015901 A1 | 2/2002 | Takebe et al. | |
| 2002/0018943 A1 | 2/2002 | Baba et al. | |
| 2006/0051685 A1 | 3/2006 | Fujimori et al. | |

FOREIGN PATENT DOCUMENTS

WO  WO 2004/099876 A1  11/2004
WO  WO-2007/049814 A1 * 5/2007

OTHER PUBLICATIONS

RN 578-95-0, Registry file from ACS on STN, entered STN on Nov. 16, 1984, 6 pages.
"Acridon-Wikipedia", printed out on Jan. 7, 2008, from http://de.wikipedia.org/wiki/Acridon, 2 pages.
Chamberlain, Joseph, A Textbook of Organic Chemisry, Philadelphia, P. Blakistons' Son & Co, copyright 1921 (no month), p. 667, obtained from http://books.google.com/books?id=91s6AAAAMAAJ from Google books.
Andrews et al "Transition Temperatures of Polymer" from Brandrup et al, eds, Polymer handbook, Fourth Edition, John Wiley & Sons, Inc, New York, N.Y. 1999, pp. V1/193-V1/219. V1/252-V1/ 259.
Bicerano, "Glass Tansition" from article online posting date of Oct. 22, 2001 from Encyclopedia of Polymer Science and Technology, John Wiley & Sons, Inc, 28 pages. Copyright The Dow Chemical Company, 2002.
Ryong-Joon Roe, "Glass Transition" pp. 531-544 in vol. 7 of Encydopedia of Polymer Science and Engineering, revised ed., John Wiley & Sons, Inc. New York, N.Y. 1987.
Morrison et al, Organic Chemistry, 3rd ed, Allyn and Bacon, Inc, Boston, MA, 1973 (no month), pp. 579-582 and 658-660.
"Phtalocyanine Gree G-Wikipedia, the free encylopedia" 2 pages printed out on Jan. 7, 2008, http://en.wikipedia.org/wiki/Phtalo_Green.
RN 17025-47-7, Registry file in ACS on STN, entered Nov. 16, 1984 for phenyl tribromomethyl sulfone.
RN 1328-53-6 Registry file ACS on STN, entered Nov. 16, 1984 for C.I. Pigment Green 7.

* cited by examiner

*Primary Examiner* — Cynthia Hamilton
(74) *Attorney, Agent, or Firm* — Kile Park Goekjian Reed & McManus PLLC

(57) ABSTRACT

The present invention relates to a photosensitive resin composition including a) an alkali-soluble acrylate resin, b) a cross-linking monomer having at least two ethylenic double bonds, and c) a phosphinoxide based photopolymerization initiator and an acridon based photopolymerization initiator; a preparation method thereof; and a dry film resist comprising the same.

20 Claims, No Drawings

PHOTOSENSITIVE RESIN COMPOSITION, METHOD FOR PREPARING THE SAME, AND DRY FILM RESIST COMPRISING THE SAME

CROSS REFERENCE TO RELATED APPLICATION

This application is a Continuation-In-Part of U.S. patent application Ser. No. 11/292,411, filed Nov. 30, 2005, now abandoned which claims priority to and the benefit of Korean Patent Application No. 10-2004-0099483 filed in the Korean Patent Office on Nov. 30, 2004, the entire contents of which are incorporated hereinto by reference.

BACKGROUND OF THE INVENTION

1. Field of the Invention

The present invention relates to a photosensitive resin composition, a preparing method, and a dry film resist comprising the same, more specifically for pattering the barrier ribs of Plasma display panel (PDP).

2. Description of the Related Art

A plasma display panel (PDP) is a flat display device using a plasma phenomenon, which is also called a gas-discharge phenomenon since a discharge is generated in the panel when a potential greater than a certain level is applied to two electrodes separated from each other under a gas atmosphere in a non-vacuum state. Such a gas-discharge phenomenon is applied to display an image in the plasma display panel. At present, a generally used plasma display panel is a reflective alternating current driven plasma display panel. On a rear substrate, phosphor layers are formed in discharge cells compartmentalized by a barrier rib. The above plasma display panel forms its outer shape by positioning a rear substrate and a front substrate (for convenience, referred to as a first substrate and a second substrate, respectively) spaced with a predetermined distance therebetween and substantially parallel with each other like other flat panel display devices such as vacuum fluorescence display (VFD) or a field emission display (FED). The substrates are joined using a binder along their circumferences to form a discharge cell in a vacuum state.

Recent developments in the display industry are spurring work for manufacture of display panels with high resolution. One of the works is to form finely-patterned barrier rib in a short time.

In the prior art, a pattern of barrier rib for a plasma display panel is generally formed by coating and drying a paste composition for preparing barrier rib, forming a dry film the dried composition, covering a mask with a predetermined pattern, and exposing with Ultraviolet light. However, the conventional pattering method cannot be applied for large-sized panel, and requires a special mask adapted for newly-changed pattern. If the mask has defects, all panel prepared by using the mask have defects.

To resolve the problems in the prior art, the patterning method using a laser direct image (LDI) develops to finely-pattering the large-sized panel by removing a photomask and achieving resolution of wavelength of light source. However, the direct image pattering method requires a long exposure time and work time to lower the productivity compared to the patterning method using the photomask.

SUMMARY OF THE INVENTION

To resolve the problems in the prior art, an object of the present invention is to provide a photosensitive resin composition with an excellent sensitivity compared to the conventional photosensitive resin composition, to finely-pattern using a laser direct image (LDI) even though the photomask is not used. In addition, another object of the present invention is to provide a preparing method of the photosensitive resin composition, and the dry film resist comprising the photosensitive resin composition.

An embodiment of the present invention provides a photosensitive resin composition comprising a) the alkali-soluble acrylate resin, b) the cross-linking monomer having at least two ethylenic double bonds, and c) the phosphinoxide based photopolymerization initiator and the acridon based photopolymerization initiator.

Another embodiment of the present invention provides a method of preparing a photosensitive resin composition comprising the steps of:

polymerizing alkali-soluble acrylate resin from at least a monomer selected from the group consisting of unsaturated carboxylic acid monomer, aromatic monomer, phosphate ester-containing monomer, and aliphatic acrylic monomer; and mixing the alkali-soluble acrylate resin, cross-linking monomer having at least two ethylenic double bonds, a phosphinoxide based photopolymerization initiator, and an acridon based photopolymerization initiator.

Yet another embodiment of the present invention provides a dry film resist including the photosensitive resin composition.

DETAILED DESCRIPTION OF THE PREFERRED EMBODIMENTS

A more complete appreciation of the present invention, and many of the above and other features and advantages of the present invention, will be readily apparent as the same becomes better understood by reference to the following detailed description.

The photosensitive resin composition can form a predetermined pattern by sensitively reacting to the light, which includes a) alkali-soluble acrylate resin, b) cross-linking monomer having at least two ethylenic double bonds, and c) a phosphinoxide based photopolymerization initiator and an acridon based photopolymerization initiator.

Preferably, the photosensitive resin composition includes 40 to 100 parts, or more preferably 60 to 80 parts by weigh of the cross-linking monomer having at least two ethylenic double bonds based on 100 parts by weight of the alkali-soluble acrylate resin. In addition, the phosphinoxide based photopolymerization initiator is contained in an amount of 1 to 5 parts by weight, and the acridon based photopolymerization initiator is contained in an amount of 0.5 to 2 parts by weight based on 100 parts by weight of the alkali-soluble acrylate resin. The amount in total of the phosphinoxide based photopolymerization initiator and the acridon based photopolymerization initiator is 1.5 to 7 parts by weight.

If the amount of cross-linking monomer is less than 40 parts by weight based on 100 parts by weight of the alkali-soluble acrylate resin, the insufficient curing makes it difficult to pattern. If the amount of cross-linking monomer exceeds 100 parts by weight, the pattern is torn away in developing process, and has lower directionality.

In addition, if the amount of phosphinoxide based photopolymerization initiator is less than 1 parts by weight, the curing degree in lower part of the pattern decreases. If the amount exceeds 5 parts by weight, remaining layer in the upper part of pattern decreases after developing. If the acridon based photopolymerization initiator is contained less than 0.5 parts by weight based on 100 parts by weight of alkali-soluble acrylate resin, remaining layer in the upper part of pattern decreases after developing. If the amount is more than 2 parts by weight, the curing degree of the lower part of pattern decreases.

If the amount in total of the phosphinoxide based photopolymerization initiator and acridon based photopolymerization initiator is less than 1.5 parts by weight based on alkali-soluble acrylate resin 100 parts by weight, the low sensitivity to light makes it difficult to pattern normally and lowers the directionality of pattern. The amount in total exceeds 7 parts by weight causes a problem in the storage stability.

The alkali-soluble acrylate resin has weight-average molecular weight of 20,000 to 100,000, or more preferably 30,000 to 70,000. If the weight average molecular weight is less than 20,000, the sensitivity of the photosensitive composition and an etching resistance decease. If the weight average molecular weight is more than 100,000, the length of lower part of pattern increases.

In addition, a glass transition temperature of the alkali-soluble acrylate resin is 100° C. or higher preferably, or 150 to 200° C. more preferably. If the glass transition temperature is lower than 100° C., the composition leaks out in a dry film state.

Preferably, the alkali-soluble acrylate resin is prepared by polymerizing at least one selected from the group consisting of i) unsaturated carboxylic acid monomer, ii) aromatic monomer, iii) phosphate ester-containing monomer, and iv) aliphatic acrylic monomer. The monomer for preparing the alkali-soluble acrylate resin includes the unsaturated carboxylic acid monomer as essential component more preferably.

The unsaturated carboxylic acid monomer improves alkali-solubility of acrylate resin. Examples of the unsaturated carboxylic acid monomer includes at least one selected from the group consisting of acrylic acid, methacrylic acid, itaconic acid, maleic acid, fumaric acid, vinyl acetate and acid anhydride thereof.

In polymerizing the alkali-soluble acrylate resin, the amount of unsaturated carboxylic acid monomer is 20 to 50 weight % of an amount in total of monomer(s) preferably. If the amount of unsaturated carboxylic acid monomer is less than 20 weight %, the developing time is long after exposing. If the amount is more than 50 weight %, it has disadvantages in gelling problems of polymerizing process, difficulty in controlling the polymerization degree, and decreased storage stability of photosensitive resin composition.

An preferred examples of the aromatic monomer includes at least one selected from the group consisting of styrene, benzylmethacrylate, benzylacrylate, phenylacrylate, phenylmethacrylate, 2-nitrophenylacrylate, 4-nitrophenylacrylate, 2-nitrophenylmethacrylate, 4-nitrophenylmethacrylate, 2-nitrobenzylmethacrylate, 4-nitrobenzylmethacrylate, 2-chlorophenylacrylate, 4-chlorophenylacrylate, 2-chlorophenylmethacrylate, and 4-chlorophenylmethacrylate.

The aromatic monomer is contained in an amount of 15 to 45 weight % of an amount in total of monomer(s) preferably, or more preferably 20 to 40 weight %. If the amount of aromatic monomer is less than 15 weight %, the pattern can tear away due to decreased adhesiveness to the barrier rib in developing process, and the stable pattern cannot be obtained due to deteriorated directionality of pattern. If the amount exceeds 45 weight %, longer developing time is required, the composition can fall to pieces, and the film resist can not be removed completely due to increased heat resistance.

The phosphate ester-containing monomer improves adhesiveness of polymer and controls the acid value in a small usage amount. The various kinds of phosphate ester-containing monomer are used depending on the terminal double bond group of methacrylate. The preferred example is at least one selected from the group consisting of pentaethyleneglycol phosphate monomethacrylate, pentapropyleneglycol phosphate monomethacrylate, and hexaethyleneglycol phosphate monomethacrylate.

An amount of the phosphate ester-containing monomer is 1 to 15 weight % of an amount in total of monomer(s), or more preferably 5 to 10 weight %. If the amount of the phosphate ester-containing monomer is less than 1 weight %, the sufficient adhesiveness of the film can not be obtained. If the amount exceeds 15 weight %, the gelling occurs in polymerizing process, the film strips out due to decreased resistance to alkali in developing process, and the directionality of formed pattern can be decreased.

The aliphatic acrylic monomer controls the glass transition temperature and the polarity of polymer. The preferred example of aliphatic acrylic monomer is at least one selected from the group consisting of 2-hydroxyethylacrylate, 2-hydroxyoctylacrylate, methylacrylate, ethylacrylate, 2-hydroxyethyl methacrylate, 2-hydroxyoctylmethacrylate, methylmethacrylate, ethyl methacrylate, and n-butylacrylate. The amount of aliphatic acrylic monomer can be selected in considering the glass transition temperature, heat resistance, and hydrophilic property of the acrylate resin. The aliphatic acrylic monomer is contained in 10 to 50 weight % of all monomers preferably.

The alkali-soluble acrylate resin can be prepared by polymerizing the monomer(s) in polar solvent suitable for preventing the gelling of monomer. The preferred example of the solvent is at least one selected from the group consisting of tetrahydropuran, dioxan, dimethylaminoformaldehyde, methylethylketone, carbitol, gamma butyrolactone, and propyleneglycolmonomethylether.

The preferred example of cross-linking monomer having at least two ethylenic double bonds in the photosensitive resin composition is at least one selected from the group consisting of 1,4-butanedioldiacrylate, 1,3-butyleneglycoldiacrylate, ethyleneglycoldiacrylate, pentaerythritoltetraacrylate, triethyleneglycoldiacrylate, polyethyleneglycoldiacrylate, dipentaerythritoldiacrylate, sorbitoltriacrylate, bisphenol A diacrylate derivative, ethyleneoxide added bisphenol A diacrylate, trimethylpropanetriacrylate, ethoxylated triethylpropanetriacrylate, trimethylolpropane ethoxylated triacrylate, dipentaerythritolpolyacrylate, 1,4-butanedioldimethacrylate, 1,3-butyleneglycoldimethacrylate, ethyllleneglycoldimethacrylate, pentaerythritoltetramethacrylate, triethyleneglycoldimethacrylate, polyethyleneglycoldimethacrylate, dipentaerythritoldimethacrylate, sorbitoltrimethacrylate, bisphenol A dimethacrylate derivative, trimethylpropanetrimethacrylate, ethoxylated trimethylolpropane trimethacrylate, and dipentaerythritolpolymethacrylate.

The phosphinoxide based photopolymerization initiator is at least one selected from the group consisting of the compounds represented by the following formula 1:

Formula 1

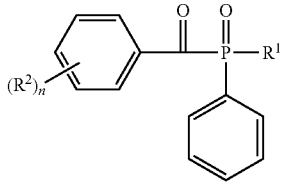

wherein, $R^1$ is a phenyl, alkyl, or trialkylbenzoyl group, $R^2$ is independently C1 to C6 alkyl group, and n is an integer of 0 to 3.

The preferred example of the compound represented by formula 1 is at least one selected from the group consisting of (2,4,6-trimethyl benzoyl)-phenylphosphinoxide and bis(2,4,6-trimethylbenzoyl)-phenylphosphinoxide.

The acridon based photopolymerization initiator the acridon based photopolymerization initiator is at least one selected from the group consisting of the compounds represented by the following formula 2:

Formula 2

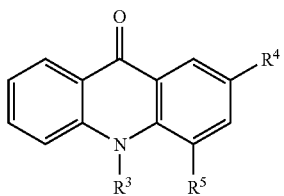

wherein, $R^3$ is a C1 to C6 alkyl, $R^4$ is a C1 to C2 alkyl or halogen, and $R^5$ is a C1 to C2 alkyl or halogen.

The preferred example of the compound represented by formula 2 is at least one selected from the group consisting of 10-methylacridone, 10-butyl-2-chloroacridone, 10-butyl-2-isopropylacridone, and 10-butyl-2,4-diethylacridone.

In addition to a) alkali-soluble acrylate resin, b) cross-linking monomer having at least two ethylenic double bonds, and c) phosphinoxide based photopolymerization initiator and acridon based photopolymerization initiator, the photosensitive resin composition according to the present invention further includes at least one selected from e) dye, f) solvent, and g) additive for improving coating property.

The preferred example of dye is at least one selected from the group consisting of leuco crystal violet, tribromomethylphenylsulfone, diamond green GH, Rhodamine B, auramine base, paramagenta, methyl orange, methylene blue, crystal violet, ethyl violet, pthalocyanine green, mansic blue 20, and Light green B.

The preferred example of additive for improving coating property is at least one selected from the group consisting of polyester modified dimethylpolysiloxane, polyhydroxycarboxylic acid amide, silicone based polyacrylate copolymer, fluorinated paraffin, etc.

The solvent can be suitably selected in considering the solubility and coating property of photosensitive resin composition. The preferred example of the solvent is at least solvent selected from the group consisting of ethyleneglycolmonomethyletheracetate, propyleneglycolmonomethylether, propyleneglycolmethyletheracetate, propyleneglycolmonoethyl etheracetate, diethyl leneglycoldimethylether, diethyl eneglycolmethylethyl ether, cyclohexanone, 3-methoxypropionic acid ethyl, 3-ethoxypropionic acid methyl, 3-ethoxypropionic acid ethyl, methylethylketone, isopropylalcohol, ethanol, and methanol.

The amounts of e) dye, f) solvent, and g) additive can be suitably selected, but are not limited particularly.

In addition, a photosensitive resin composition is prepared by polymerizing alkali-soluble acrylate resin from at least a monomer selected from the group consisting of unsaturated carboxylic acid monomer, aromatic monomer, phosphate ester-containing monomer, and aliphatic acrylic monomer; and mixing the alkali-soluble acrylate resin, cross-linking monomer having at least two ethylenic double bonds, phosphinoxide based photopolymerization initiator, and acridon based photopolymerization initiator The amount and kind of the monomer for polymerizing the alkali-soluble acrylate resin the same as those of unsaturated carboxylic acid monomer, aromatic monomer, phosphate ester-containing monomer, and aliphatic acrylic monomer.

The alkali-soluble acrylate resin can be obtained by mixing and polymerizing the four kinds of monomers, suitable polar solvent, and low temperature polymerization initiator. The polymerizing process, the temperature is not limited particularly, but 40 to 80° C. preferably.

The preferred solvent used for polymerizing the alkali-soluble acrylate resin is at least one selected from tetrahydropuran, dioxan, dimethylaminoformaldehyde, methylethylketone, carbitol, gammabutryolactone, and propyleneglycolmonomethylether.

In addition, the preferred example of low temperature polymerization initiator is at least one selected from azoamidine based initiator, azonitrile based initiator, and azoester based initiator.

The acrylate resin is mixed with b) cross-linking monomer having at least two ethylenic double bonds, and c) the phosphinoxide based photopolymerization initiator and the acridon based photopolymerization initiator to prepare the photosensitive resin composition of the present invention. In addition, at least one selected from e) dye, f) solvent, and g) additive for improving coating property can be added in the mixing step as occasion demand.

The preferred example and amount of the cross-linking monomer, the phosphinoxide based photopolymerization initiator, the acridon based photopolymerization initiator, dye, solvent and additive are the same as described above.

The photosensitive resin composition can be used by coating itself as a photosensitive resist for PDP, or can be coated and dried on polymer film to produce dry film resist for PDP.

The polymer film included in dry film resist can be that used for preparing the dry film resist generally, and more preferably polyethyleneterephthalate (PET) film or polyethylene film. The thickness of the film is 15 μm to 30 μm preferably. If the thickness is less than 15 μm, the film is easy to tear due to low tension. If the thickness is more than 30 μm, transmission decreases in exposing process due to low turbidity.

One side of the polymer film is coated by the photosensitive resin composition of the present invention in a certain thickness on, dried, and then is overlaid by the polymer film again to produce the dry film resist.

The following examples illustrate the present invention in further detail. However, it is understood that the present invention is not limited by these examples.

Examples 1 and 2

Preparation of Alkali-Soluble Acrylate Resin

The alkali-soluble acrylate resins of Examples 1 and 2 were prepared by polymerizing the components and compositions shown in Table 1 at a temperature of 45° C. Propyleneglycol monomethyl ether (PGME) as the solvent in the polymerizing was used in an amount of 60 parts by weight to 40 parts by weight of monomers. The low temperature polymerization initiator was an ester based initiator.

TABLE 1

(unit: parts by weight)

| Component | | EXAMPLE 1 | EXAMPLE 2 |
|---|---|---|---|
| Unsaturated carboxylic acid monomer | MA | 25 | 25 |
| Aromatic monomer | BM | 22 | 22 |
| Phosphate ester-containing methaacrylate monomer | PAM-100 | 7 | — |
| Phosphate ester-containing methaacrylate monomer | PAM-200 | — | 7 |
| Aliphatic acrylic monomer | HEMA | 20 | 20 |
| Aliphatic acrylic monomer | MMA | 26 | 26 |
| Solvent | PGME | 150 | 150 |
| Molecular weight | | 40,000 | 42,000 |

Note:
benzylmethaacrylate: BM
methaacrylic acid: MA
2-hydroxyethyl methaacrylate: HEMA
Phosphate ester-containing methaacrylate monomers: RHODIA, PAM-100 and PAM-200:
Methylmethaacrylate: MMA Examples 3 to 7 and Comparative Examples 1 to 2

Preparation of Photosensitive Resin Composition

The alkali-soluble acrylate resins of Examples 1 and 2 were dissolved by adding the cross-linking monomer, the photopolymerization initiator, and dye according to the compositions shown in Table 2, agitated for 2 hours at a room temperature of 25° C., and then filtered to remove impurities so as to produce the photosensitive resin compositions of Examples 3 to 7 and Comparative Examples 1 to 2.

Each photosensitive resin composition prepared in Examples 3 to 7, and Comparative Examples 1 to 2 was coated on a polyethylene terephthalate (PET) film with a thickness of 25 μm for the first film by using an applicator. Then, it was dried by a hot wind at 100° C. for 10 minutes to form a photosensitive resin composition layer having a final thickness of 20 μm. Thereafter, a polyethylene (PE) film with a thickness of 25 μm was covered on the dried photosensitive resin composition layer and was pressed by using a rubber roller, so that no foams remained, to prepare a photosensitive dry film resist.

The prepared dry film resist was laminated on the barrier rib substrate. Then, the sensitivity, resolution, acid resistance in substrate etching process, and stripping property in alkali were tested for each barrier rib substrate having laminated dry film resist, and the test results are summarized in Table 3 below.

Sensitivity (mJ) is defined by multiplying intensity of illumination by time, and was determined by measuring with a diode laser of 405 nm in a 25 plate tablet mask.

Resolution was determined by reacting with 0.4 weight % $Na_2CO_3$ solution for 60 sec. after exposing to light of 10 mJ.

Acid resistance was determined by reacting with 1.0% of nitric acid aqueous solution for 300 sec. at 60° C.

Stripping property was determined by reacting with 3.0% NaOH solution for 40 sec. at 55° C.

TABLE 3

| | Sensitivity | Resolution | Acid resistance[1] | Stripping[2] property |
|---|---|---|---|---|
| Example 3 | 2.5 mJ | 10 μm | ◯ | ◯ |
| Example 4 | 2.0 mJ | 10 μm | ◯ | ◯ |
| Example 5 | 2.0 mJ | 10 μm | ◯ | ◯ |
| Example 6 | 1.5 mJ | 8 μm | ◯ | ◯ |
| Example 7 | 2.0 mJ | 10 μm | ◯ | ◯ |

TABLE 2

(unit: parts by weight)

| | | Example | | | | | Comparative Example | |
|---|---|---|---|---|---|---|---|---|
| Component | | 3 | 4 | 5 | 6 | 7 | 1 | 2 |
| Acrylate resin | Resin 1 | 100 | — | 50 | 100 | 100 | 100 | 100 |
| | Resin 2 | — | 100 | 50 | — | — | — | — |
| Cross-linking monomer | TMP(EO)$_3$TA | 24 | 24 | 24 | 24 | 24 | 24 | 24 |
| Cross-linking monomer | BPA(EO)$_{10}$DA | 48 | 48 | 48 | 24 | 48 | 48 | 48 |
| Phosphinoxide based polymerization initiator | I-819 | 4 | 4 | 4 | 4 | 2 | 6 | — |
| Acridone based polymerization initiator | nBCA | 2 | 2 | 2 | 2 | 4 | — | 6 |
| Basic dye | Green S-3G | 0.5 | 0.5 | 0.5 | 0.5 | 0.5 | 0.5 | 0.5 |
| Chromogenic dye | A-DMA | 1.5 | 1.5 | 1.5 | 1.5 | 1.5 | 1.5 | 1.5 |
| Solvent | PGME | 20 | 20 | 20 | 20 | 20 | 20 | 20 |

Note:
The abbreviations in Table 2 are as follow:
Resin 1: alkali-soluble acrylate resin obtained in Example 1
Resin 2: alkali-soluble acrylate resin obtained in Example 2
TMP(EO)$_3$TA: Trimethylolpropane ethoxylated triacrylate (Miwon Commercial Co., Ltd, MIRAMER M310)
BPA(EO)$_{10}$DA: ethyleneoxide added bisphenol A diacrylate (NIPPON KAYAKU Co. Ltd.),
I-819: bis(2,4,6-trimethylbenzoyl)-phenylphosphinoxide (Cibas specialty chemicals Inc.)
nBCA: n-butylcholoroacridon (KUROGANE KASEI Co. Ltd.)
DMA: leuco crystal violet (HODOGAYA CHEMICAL Co. Ltd.)
PGME: propyleneglycolmonomethylether.

TABLE 3-continued

|  | Sensitivity | Resolution | Acid resistance[1] | Stripping[2] property |
|---|---|---|---|---|
| Comparative Example 1 | 2.0 mJ | 20 μm | ○ | Δ |
| Comparative Example 2 | 4.5 mJ | 15 μm | ○ | ○ |

As shown in Table 3, the acid resistance and stripping property are indicated according to the following references: good (○), bad (Δ), and very bad (X).
Note)
[1]Acid resistance measure standard: good (○): This means that 100% of the resist patterned on the barrier rib substrate during the etching process is not stripped and the barrier rib type of the barrier rib substrate is not damaged. bad (Δ): This means that 20~30% of the resist patterned on the barrier rib substrate during the etching process is stripped and any part of the barrier rib type of the barrier rib substrate is damaged. very bad (X): This means that 70~80% of the resist patterned on the barrier rib substrate during the etching process is stripped and most of the barrier rib type of the barrier rib substrate is damaged.
[2]Stripping property measure standard: good (○): This means that the resist on the barrier rib substrate after the etching process and stripping process is completely removed (100% removed). bad (Δ): This means that 20~30% of the resist on the barrier rib substrate after the etching process and stripping process remains by non-stripping. very bad (X): This means that 70~80% of the resist on the barrier rib substrate after the etching process and stripping process is not removed.

Example 8 to 12 and Comparative Examples 3 to 4

Preparation of Dry Film Resist

The photosensitive resin compositions obtained in Examples 3 to 7 and Comparative Examples 1 to 2 were coated with an applicator on polyethyleneterephthalate (PET) to a thickness of 25 μm as a first film, and dried to obtain a dry film of photosensitive resin composition with a final thickness of 20 p.m. A polyethylene film as a second film was overlaid on the dry film with a 25 μm thickness, and then pressed with a rubber roller to remove air bubbles to produce the dry film resist.

The compositions of dry film resists obtained according to Examples 8 to 12 and Comparative Examples 3 to 4 are summarized in Table 4.

TABLE 4

(unit: parts by weight)

| Dry film resist | Photosensitive resin | First film | Second film |
|---|---|---|---|
| Example 8 | Example 3 | PET with 25 μm thick | PE with 25 μm thick |
| Example 9 | Example 4 | | |
| Example 10 | Example 5 | | |
| Example 11 | Example 6 | | |
| Example 12 | Example 7 | | |
| Comparative Example 3 | Comparative Example 1 | | |
| Comparative Example 4 | Comparative Example 2 | | |

The sensitivity, resolution, acid resistance in substrate etching process, and stripping property in alkali were tested for the dry film resists of Examples 8 to 12, and Comparative Examples 3 to 4. The test results are summarized in Table 5 below.

Sensitivity (mJ) is defined by multiplying intensity of illumination by time, and was determined by measuring with a diode laser of 405 nm in a 25 plate tablet mask.

Resolution was determined by reacting with 0.4 weight % $Na_2CO_3$ solution for 60 sec. after exposing to light of 10 mJ.

Acid resistance was determined by reacting with 1.0% of nitric acid aqueous solution for 300 sec. at 60° C.

Stripping property was determined by reacting with 3.0% NaOH solution for 40 sec. at 55° C.

TABLE 5

|  | Sensitivity | Resolution | Acid resistance | Stripping property |
|---|---|---|---|---|
| Example 8 | 3.0 mJ | 10 μm | ○ | ○ |
| Example 9 | 2.5 mJ | 10 μm | ○ | ○ |
| Example 10 | 2.5 mJ | 10 μm | ○ | ○ |
| Example 11 | 2.0 mJ | 8 μm | ○ | ○ |
| Example 12 | 2.5 mJ | 10 μm | ○ | ○ |
| Comparative Example 3 | 2.5 mJ | 20 μm | ○ | Δ |
| Comparative Example 4 | 5.0 mJ | 15 μm | ○ | ○ |

In Table 5, the acid resistance and stripping property are indicated according to the following references: good (O), bad (Δ), and very bad (X). In addition, the valuation method for the acid resistance and stripping property was measured by using the same method as in Examples 3~7.

As shown in Table 5, the dry film resist of Examples 8 to 12 could form the pattern at low sensitivity, and had excellent resolution, acid resistance, and stripping property compared to those of Comparative Examples 3 and 4.

According to the photosensitive resin composition and the dry film resist, it is easy to finely pattern using a laser direct image (LDI) with high density and the dry film has excellent sensitivity, resolution, and adhesiveness to the substrate.

What is claimed is:

1. A photosensitive resin composition comprising a) 100 parts by weight of an alkali-soluble acrylate resin, b) 40 to 100 parts by weight of a cross-linking monomer having at least two ethylenic double bonds, c) 1.5 to 7 parts by weight of the mixture of a phosphine oxide based photopolymerization initiator and an acridon based photopolymerization initiator, wherein the alkali-soluble acrylate resin is prepared by polymerizing a mixture of 20 to 50 weight % of an unsaturated carboxylic acid monomer, 15 to 45 weight % of an aromatic monomer, 1 to 15 weight % of a phosphate ester-containing monomer, and 10 to 50 weight % of an aliphatic acrylic monomer, wherein the phosphine oxide based photopolymerization initiator is at least one compound selected from the group consisting of the compounds represented by the following formula 1:

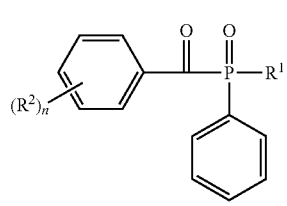

Formula 1 wherein, $R^1$ is a phenyl, alkyl, or trialkylbenzoyl group, $R^2$ is independently a C1 to C6 alkyl group, and n is an integer of 0 to 3, wherein the acridon based photopolymerization initiator is at least one compound selected from the group consisting of 10-methylacridone, 10-butyl-2-chloroacridone, 10-butyl-2-isopropylacridone, and the compounds represented by the following formula 2:

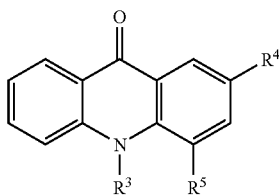

Formula 2 wherein, $R^3$ is a C1 to C6 alkyl, $R^4$ is a C1 to C2 alkyl or a halogen, and $R^5$ is a C1 to C2 alkyl or a halogen.

2. The photosensitive resin composition according to claim 1, wherein the alkali-soluble acrylate resin has a weight-average molecular weight of 20,000 to 100,000.

3. The photosensitive resin composition according to claim 1, wherein the alkali-soluble acrylate resin has a weight-average molecular weight of 30,000 to 70,000.

4. The photosensitive resin composition according to claim 1, wherein the unsaturated carboxylic acid monomer is selected from the group consisting of acrylic acid, methacrylic acid, itaconic acid, maleic acid, furmaric acid, and any combination thereof.

5. The photosensitive resin composition according to claim 1, wherein the aromatic monomer is selected from the group consisting of styrene, benzylmethacrylate, benzylacrylate, phenylacrylate, phenylmethacrylate, 2-nitrophenylacrylate, 4-nitrophenylacrylate, 2-nitrophenylmethacrylate, 4-nitrophenylmethacrylate, 2-nitrobenzylmethacrylate, 4-nitrobenzylmethacrylate, 2-chlorophenylacrylate, 4-chlorophenylacrylate, 2-chlorophenylmethacrylate, 4-chlorophenylmethacrylate, and any combination thereof.

6. The photosensitive resin composition according to claim 1, wherein the phosphate ester-containing monomer is selected from the group consisting of pentaethyleneglycol phosphate monomethacrylate, pentapropyleneglycol phosphate monomethacrylate, hexaethyleneglycol phosphate monomethacrylate, and any combination thereof.

7. The photosensitive resin composition according to claim 1, wherein the aliphatic acrylic monomer is selected from the group consisting of 2-hydroxyethylacrylate, 2-hydroxyoctylacrylate, methylacrylate, ethylacrylate, 2-hydroxyethyl methacrylate, 2-hydroxyoctylmethacrylate, methylmethacrylate, ethyl methacrylate, n-butylacrylate, and any combination thereof.

8. The photosensitive resin composition according to claim 1, wherein the cross-linking monomer is selected from the group consisting of 1,4-butanedioldiacrylate, 1,3-butyleneglycoldiacrylate, ethyleneglycoldiacrylate, pentaerythritoltetraacrylate, triethyleneglycoldiacrylate, polyethyleneglycoldiacrylate, dipentaerythritoldiacrylate, solbitoltriacrylate, bisphenol A diacrylate derivative, ethyleneoxide added bisphenol A diacrylate, trimethylpropanetriacrylate, ethyleneoxide added triethylpropanetriacrylate, trimethylolpropane ethoxylated triacrylate, dipentaerythritolpolyacrylate, 1,4-butanedioldimethaacrylate, 1,3-butyleneglycoldimethaacrylate, ethyleneglycoldimethaacrylate, pentaerythritoltetramethaacrylate, triethyleneglycoldimethaacrylate, polyethyleneglycoldimethaacrylate, dipentaerythritoldimethaacrylate, solbitoltrimethaacrylate, bisphenol A dimethaacrylate derivative, trimethylpropanetrimethaacrylate, ethyleneoxide added trimethylpropanetrimethaacrylate, dipentaerythritolpolymethaacrylate, and any combination thereof.

9. The photosensitive resin composition according to claim 1, wherein the phosphine oxide based photopolymerization initiator is at least one compound selected from the group consisting of (2,4,6-trimethyl benzoyl)-phenylphosphinoxide and bis(2,4,6-trkmethylbenzoly)-phenylphosphinoxide.

10. The photosensitive resin composition according to claim 1, wherein the photosensitive resin composition further comprises at least one compound selected from the group consisting of leuco crystal violet, Rhodamine B, auramine base, methyl orange, methylene blue, crystal violet, ethyl violet, and phthalocyanine green.

11. The photosensitive resin composition according to claim 1, wherein the photosensitive resin composition further comprises an additive for improving the coating property.

12. The photosensitive resin composition according to claim 1, wherein the photosensitive resin composition further comprises at least one solvent selected from the group consisting of ethyleneglycolmonomethyletheracetate, propyleneglycolmonomethylether, propyleneglycolmethyletheracetate, propyleneglycolmonoethyletheracetate, diethyleneglycoldimethylether, diethyleneglycolmethylethylether, cyclohexanone, 3-methoxypropionic acid ethyl ester, 3-ethoxypropionic acid methyl ester, 3-ethoxypropionic acid ethyl ester, methylethylketone, isopropylalcohol, ethanol, and methanol.

13. A photosensitive dry film resist comprising the photosensitive resin composition according to claim 1.

14. A method of preparing a photosensitive resin composition comprising the steps of:
polymerizing an unsaturated carboxylic acid monomer, an aromatic monomer, a phosphate ester-containing monomer, and an aliphatic acrylic monomer to produce an alkali-soluble acrylate resin; and
mixing the alkali-soluble acrylate resin, a cross-linking monomer having at least two ethylenic double bonds, a phosphine oxide based photopolymerization initiator, and an acridon based photopolymerization initiator,
wherein the phosphine oxide based photopolymerization initiator is at least one compound selected from the group consisting of the compounds represented by the following formula 1:

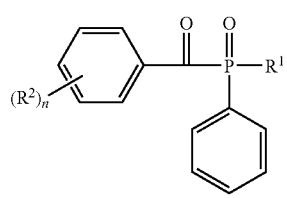

Formula 1 wherein, $R^1$ is a phenyl, alkyl, or trialkylbenzoyl group, $R^2$ is independently a C1 to C6 alkyl group, and n is an integer of 0 to 3,
wherein the acridon based photopolymerization initiator is at least one compound selected from the group consisting of 10-methylacridone, 10-butyl-2-chloroacridone, 10-butyl-2-isopropylacridone, and the compounds represented by the following formula 2:

Formula 2

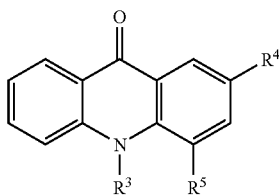

wherein, $R^3$ is a C1 to C6 alkyl, $R^4$ is a C1 to C2 alkyl or a halogen, and $R^5$ is a C1 to C2 alkyl or a halogen.

15. The method of preparing a photosensitive resin composition according to claim 14, wherein the unsaturated carboxylic acid monomer is selected from the group consisting of acrylic acid, methacrylic acid, itaconic acid, maleic acid, furmaric acid, and any combination thereof.

16. The method of preparing a photosensitive resin composition according to claim 14, wherein the aromatic monomer is selected from the group consisting of styrene, benzylmethacrylate, benzylacrylate, phenylacrylate, phenylmethacrylate, 2-nitrophenylacrylate, 4-nitrophenylacrylate, 2-nitrophenylmethacrylate, 4-nitrophenylmethacrylate, 2-nitrobenzylmethacrylate, 4-nitrobenzylmethacrylate, 2-chlorophenylacrylate, 4-chlorophenylacrylate, 2-chlorophenylmethacrylate, 4-chlorophenylmethacrylate, and any combination thereof.

17. The method of preparing a photosensitive resin composition according to claim 14, wherein the phosphate ester-containing monomer is selected from the group consisting of pentaethyleneglycol phosphate monomethaacrylate, pentapropyleneglycol phosphate monomethaacrylate, hexaethyleneglycol phosphate monomethaacrylate, and any combination thereof.

18. The method of preparing a photosensitive resin composition according to claim 14, wherein the aliphatic acrylic monomer is selected from the group consisting of 2-hydroxyethylacrylate, 2-hydroxyoctylacrylate, methylacrylate, ethylacrylate, 2-hydroxyethyl methaacrylate, 2-hydroxyoctylmethaacrylate, methylmethaacrylate, ethyl methaacrylate, n-butylacrylate, and any combination thereof.

19. The method of preparing a photosensitive resin composition according to claim 14, wherein the cross-linking monomer is selected from the group consisting of 1,4-butanedioldiacrylate, 1,3-butyleneglycoldiacrylate, ethyleneglycoldiacrylate, pentaerythritoltetraacrylate, triethyleneglycoldiacrylate, polyethyleneglycoldiacrylate, dipentaerythritoldiacrylate, solbitoltriacrylate, bisphenol A diacrylate derivative, ethyleneoxide added bisphenol A diacrylate, trimethylpropanetriacrylate, ethyleneoxide added triethylpropanetriacrylate, trimethylolpropane ethoxylated triacrylate, dipentaerythritolpolyacrylate, 1,4-butanedioldimethaacrylate, 1,3-butylleneglycoldimethaacrylate, ethyleneglycoldimethaacrylate, pentaerythritoltetramethaacrylate, triethyleneglycoldimethaacrylate, polyethyleneglycoldimethaacrylate, dipentaerythritoldimethaacrylate, solbitoltrimethaacrylate, bisphenol A dimethaacrylate derivative, trimethylpropanetrimethaacrylate, ethyleneoxide added trimethylpropanetrimethaacrylate, dipentaerythritolpolymethaacrylate, and any combination thereof.

20. The method of preparing a photosensitive resin composition according to claim 14, wherein the phosphine oxide based photopolymerization initiator is at least one compound selected from the group consisting of (2,4,6-trimethyl benzoyl)-phenylphosphinoxide and bis(2,4,6-trimethylbenzoly)-phenylphosphinoxide.

* * * * *